US 6,576,402 B2

(12) United States Patent
Heerman et al.

(10) Patent No.: US 6,576,402 B2
(45) Date of Patent: Jun. 10, 2003

(54) METHOD FOR PRODUCING WIRING CONFIGURATIONS HAVING COARSE CONDUCTOR STRUCTURES AND AT LEAST ONE REGION HAVING FINE CONDUCTOR STRUCTURES

(75) Inventors: Marcel Heerman, Merelbeke (BE); Eddy Roelants, Bruegge (BE); Jozef Van Puymbroeck, Oostkamp (BE)

(73) Assignee: Siemens Production & Logistics Systems AG, Nuremberg (DE)

( * ) Notice: Subject to any disclaimer, the term of this patent is extended or adjusted under 35 U.S.C. 154(b) by 27 days.

(21) Appl. No.: 09/835,336

(22) Filed: Apr. 16, 2001

(65) Prior Publication Data
US 2002/0110752 A1 Aug. 15, 2002

(30) Foreign Application Priority Data
Feb. 12, 2001 (DE) .......................... 101 06 399

(51) Int. Cl.⁷ .............................. H05K 3/00; H05K 3/06; G03F 7/00
(52) U.S. Cl. ........................ 430/313; 430/318; 430/945; 216/13; 216/14; 216/15
(58) Field of Search ................................ 430/313, 318, 430/945; 216/13–19, 41–51, 94

(56) References Cited
U.S. PATENT DOCUMENTS

| | | | | | |
|---|---|---|---|---|---|
| 5,110,664 | A | * | 5/1992 | Nakanishi et al. | 428/195 |
| 5,472,828 | A | * | 12/1995 | Akins et al. | 430/318 |
| 5,582,745 | A | * | 12/1996 | Hans et al. | 430/313 |
| 5,837,427 | A | * | 11/1998 | Hwang et al. | 430/313 |
| 5,895,581 | A | * | 4/1999 | Grunwald | 216/51 |
| 5,985,521 | A | * | 11/1999 | Hirano et al. | 430/314 |

FOREIGN PATENT DOCUMENTS

| GB | 2 213 325 A | 8/1989 |
|---|---|---|
| WO | WO 00/04750 | 1/2000 |

* cited by examiner

Primary Examiner—Mark F. Huff
Assistant Examiner—Kripa Sagar
(74) Attorney, Agent, or Firm—Laurence A. Greenberg; Werner H. Stemer; Ralph E. Locher

(57) ABSTRACT

A metal layer, an etching resist and a photoresist are successively applied to an electrically insulating substrate. Whereupon the photoresist is patterned by photolithography in such a way that it covers a pattern of the later coarse conductor structures and the entire region of the later fine conductor structures. After the uncovered etching resist has been stripped, the photoresist is removed, whereupon the etching resist is patterned with the aid of a laser beam in such a way that it has the pattern of the fine conductor structures. The coarse conductor structures and the fine conductor structures are then formed in a common etching process.

8 Claims, 6 Drawing Sheets

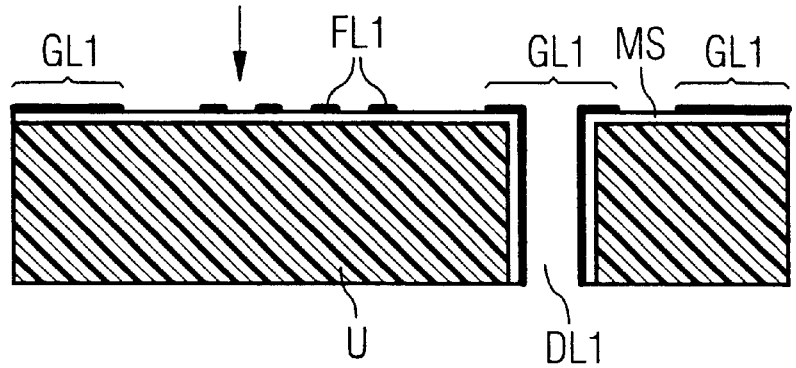
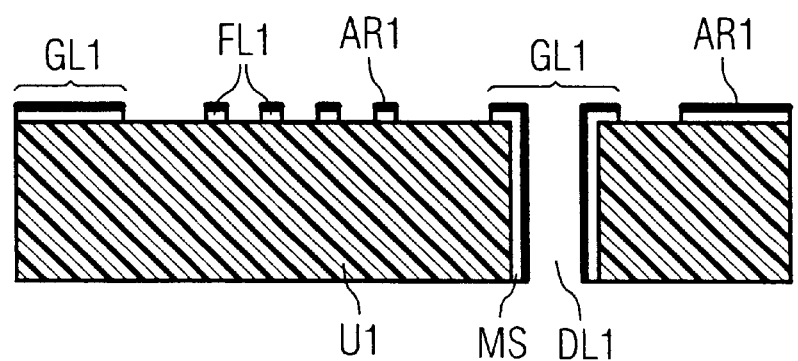
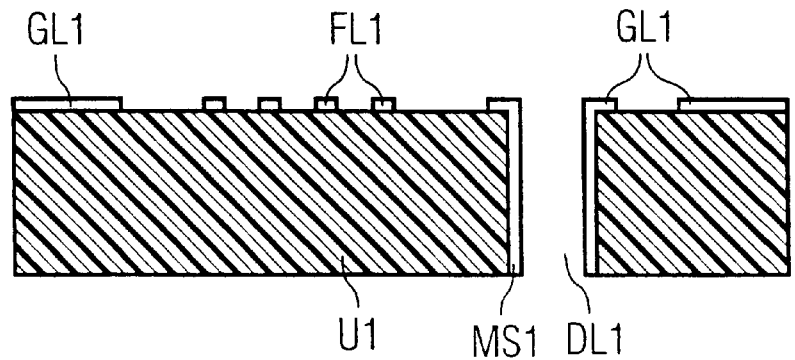

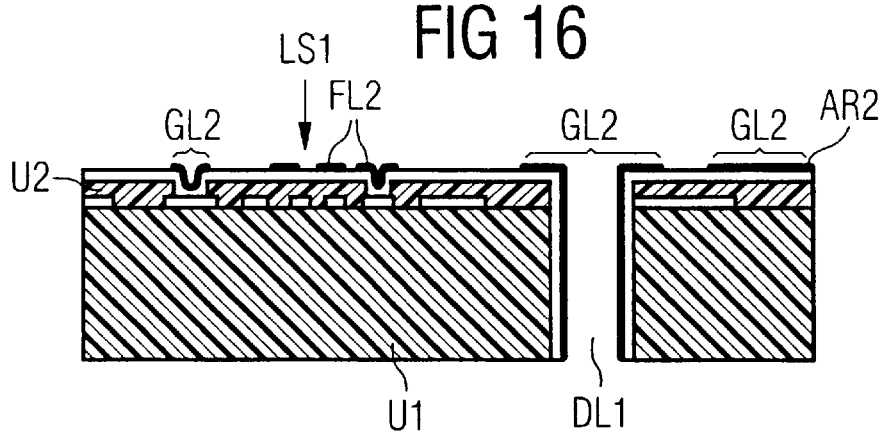
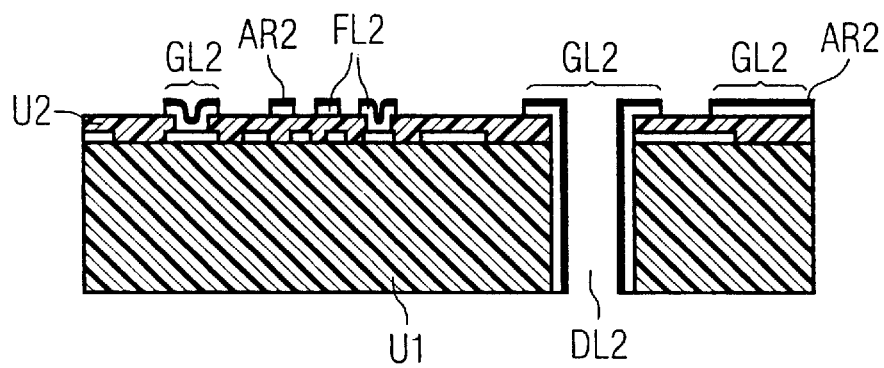
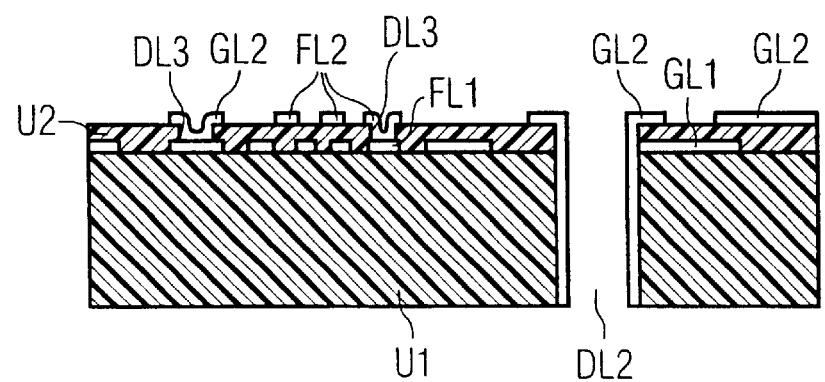

METHOD FOR PRODUCING WIRING CONFIGURATIONS HAVING COARSE CONDUCTOR STRUCTURES AND AT LEAST ONE REGION HAVING FINE CONDUCTOR STRUCTURES

BACKGROUND OF THE INVENTION

1. Field of the Invention

Published, European Patent Application EP 0 602 258 A discloses a method for producing printed circuit boards having coarse conductor structures, in which case, however, a delimited region of the printed circuit boards is intended to obtain a very high wiring density. This is achieved by an additional wiring layer which is applied only in the delimited region and is connected to the underlying wiring layer via plated-through holes.

Published, European Patent Application EP 0 062 300 A discloses a method for producing printed circuit boards in which a metallic etching resist that has been applied over the whole area of a metal layer is selectively removed again by laser radiation in the regions which do not correspond to the conductor structures, and the conductor structures are formed by etching away the metal layer that is uncovered in this way.

International Patent Disclosure WO 00/04750 discloses a method for producing printed circuit boards having coarse conductor structures and at least one region having fine conductor structures in which the coarse conductor structures and the fine conductor structures are etched out of a metal layer in a common etching process. During the common etching process, an etching resist patterned by photolithography is used in the region of the coarse conductor structures and an etching resist patterned with the aid of a laser beam is used in the region of the fine conductor structures. In accordance with a first embodiment of the known method, a photoresist is applied to the metal layer and patterned by photolithography in such a way that, in the region of the coarse conductor structures, it has a negative pattern of the coarse conductor structures, and that it covers the entire region of the fine conductor structures. In the region of the fine conductor structures, the photoresist is then patterned with the aid of a laser beam in such a way that it has the negative pattern of the fine conductor structures. The etching resist is then applied to the coarse and fine conductor structures for example by the externally electroless deposition of tin in one work operation, so that the common etching process can be carried out after the removal of the photoresist. In accordance with a second embodiment of the known method, the photoresist applied to the metal layer is patterned by photolithography in such a way that, in the region of the coarse conductor structures, it has a negative pattern of the coarse conductor structures. The etching resist is then applied to the coarse conductor structures and to the entire region of the fine conductor structures. After the removal of the photoresist, the etching resist is then patterned in the region of the fine conductor structures with the aid of the laser beam in such a way that it has the pattern of the fine conductor structures. The coarse conductor structures and the fine conductor structures are then once again produced in a common etching process.

SUMMARY OF THE INVENTION

It is accordingly an object of the invention to provide a method for producing wiring configurations having coarse conductor structures and at least one region having fine conductor structures which overcomes the above-mentioned disadvantages of the prior art methods of this general type, in such a way that it can be carried out in a shorter time.

With the foregoing and other objects in view there is provided, in accordance with the invention, a method for producing wiring configurations. The method includes providing an electrically insulating substrate, applying a metal layer to the electrically insulating substrate, applying an etching resist to the metal layer, applying a photoresist to the etching resist, patterning the photoresist using photolithography such that a pattern of coarse conductor structures and a region of fine conductor structures are covered, removing the etching resist in regions not covered by the photoresist, removing the photoresist, patterning the etching resist with a laser beam such that it has a pattern of the fine conductor structures, and etching away those regions of the metal layer which are not protected by the etching resist as far as a surface of the electrically insulating substrate in a common etching process to form the coarse conductor structures and the fine conductor structures.

The invention is based on the insight that, by combining conventional photoetching technology for producing the coarse conductor structures and the laser patterning for producing the fine conductor structures, in each case large regions of the photoresist, of the etching resist and of the metal layer can be rapidly removed by the steps of exposing and developing the photoresist, stripping the etching resist and etching the metal layer. Since the laser patterning of the etching resist in the region of the fine conductor structures can be carried out rapidly in any case, the result is that overall minimal time is taken.

Although, in principle, organic resists can also be used as the etching resist, a metallic etching resist is preferred. The application of the metallic etching resist to the metal layer can then be performed rapidly and with little outlay by externally electroless or electrical metal deposition. In this case, the use of tin or tin-led as etching resist has proved particularly successful.

It is possible to produce plated-through holes both in the region of the coarse conductor structures and in the region of the fine conductor structures.

In accordance with an added mode of the invention, there is the step of applying the photoresist such that openings of the plated-through holes are covered with the photoresist.

If the etching resist disturbs the further treatment of the wiring configuration, it is removed again. In this case, it is then possible for example to apply other metal layers to the coarse and to the fine conductor structures.

In a refinement of the invention, it is possible, in a simple manner, to produce wiring configurations having two or else having a plurality of wiring layers which in turn have coarse and fine conductor structures.

In accordance with a concomitant mode of the invention, there are the step of forming a first wiring layer from the coarse conductor structures and/or the fine conductor structures on the electrically insulating substrate, applying a further electrically insulating substrate to the first wiring layer, forming further through holes in the further electrically insulating substrate, applying a further metal layer to the further electrically insulating substrate including the further through holes resulting in further plated-through holes, applying a further etching resist to the further metal layer, applying a further photoresist to the further etching resist, patterning the further photoresist using photolithography such that a pattern of further coarse conductor structures and a region of further fine conductor structures are covered, removing the further etching resist in regions not covered by the further photoresist, removing the further photoresist, patterning the further etching resist with the laser beam such that it has the pattern of the further fine conductor structures, etching away those regions of the further metal layer which are not protected by the further etching resist as far as a surface of the further electrically insulating substrate in a further common etching process to form the further coarse conductor structures and the further fine conductor structures, and forming a second wiring layer from the further coarse conductor structures and the further fine conductor structures.

Other features which are considered as characteristic for the invention are set forth in the appended claims.

Although the invention is illustrated and described herein as embodied in a method for producing wiring configurations having coarse conductor structures and at least one region having fine conductor structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 9 are diagrammatic, sectional views showing various method stages of a method for producing printed circuit boards having coarse conductor structures and a region having fine conductor structures according to the invention; and FIGS. 10 to 18 are sectional views showing various method stages in the production of printed circuit boards having two wiring layers which each have the coarse conductor structures and a region having the fine conductor structures.

DESCRIPTION OF THE PREFERRED EMBODIMENTS

Figure 1:
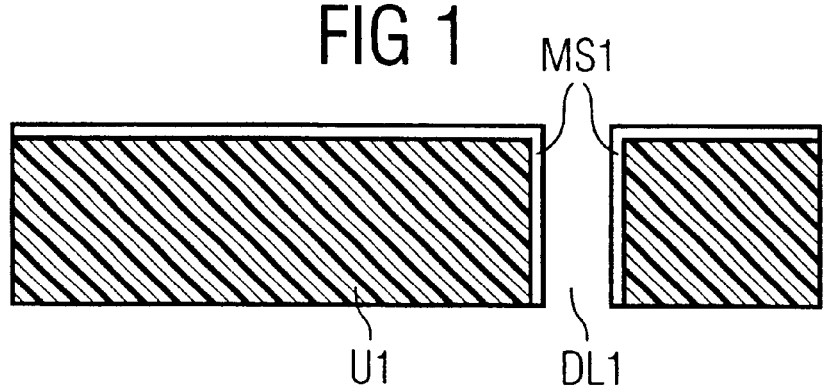

In all the figures of the drawing, sub-features and integral parts that correspond to one another bear the same reference symbol in each case. Referring now to the figures of the drawing in detail and first, particularly, to FIG. 1 thereof, there is shown a first metal layer MS1 that is applied to an electrically insulating substrate U1 illustrated in section, which metal layer MS1 also covers a wall of a plated-through hole DL1 introduced into the substrate U1. The substrate U1 is, for example, a customary base material for printed circuit boards. The first metal layer MS1 is applied to the substrate U1 for example by externally electroless and subsequent electrical deposition of copper. It is also possible to proceed from a copper-coated substrate U1 into which the plated-through hole DL1 is then bored, whereupon the wall of the plated-through hole DL1 is metalized by externally electroless and electrical metal deposition. The copper coating is correspondingly reinforced during the metalization of the plated-through holes DL1.

Figure 2:
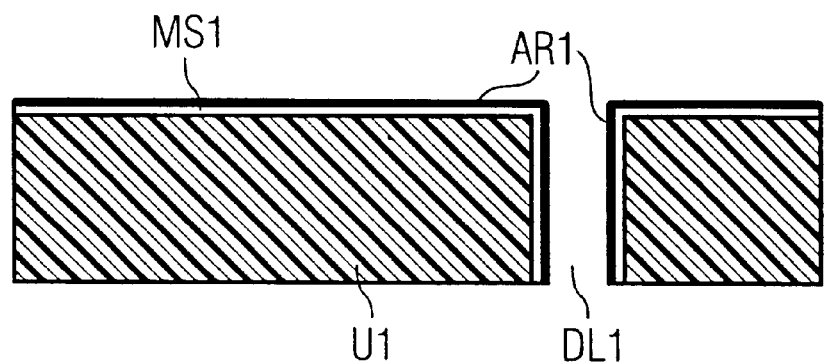

In accordance with FIG. 2, an etching resist AR1 is applied to the first metal layer MS1, and also covers the metal layer MS1 in the plated-through hole DL1. The etching resist AR1 is, for example, tin which is applied by externally electroless metal deposition.

Figure 3:
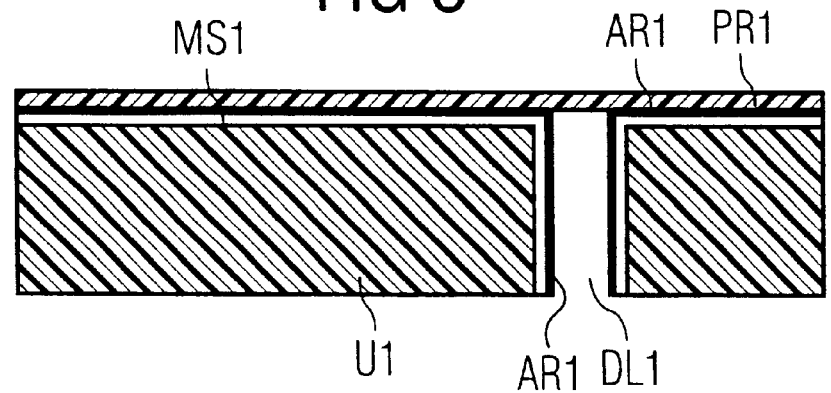

In accordance with FIG. 3, on the top side of the substrate U1, a first photoresist PR1 is then applied to the etching resist AR1. It can be seen that the first photoresist PR1 covers the upper opening of the plated-through hole DL1. The first photoresist PR1 is laminated on for example in the form of a sheet.

Figure 4:
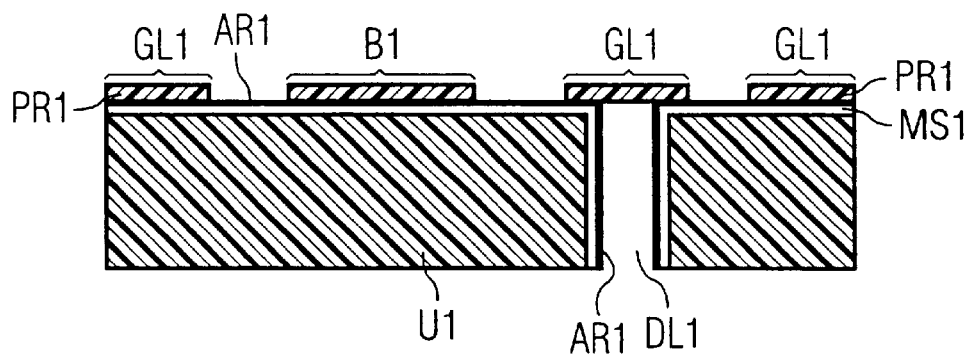

The photoresist PR1 is then patterned in the next step by exposure and development in such a way that the pattern designated by GL1—of later coarse conductor structures and a region—designated by B1—of later fine conductor structures are covered. The patterning of the photoresist PR1 by photolithography can be seen from FIG. 4.

Figure 5:
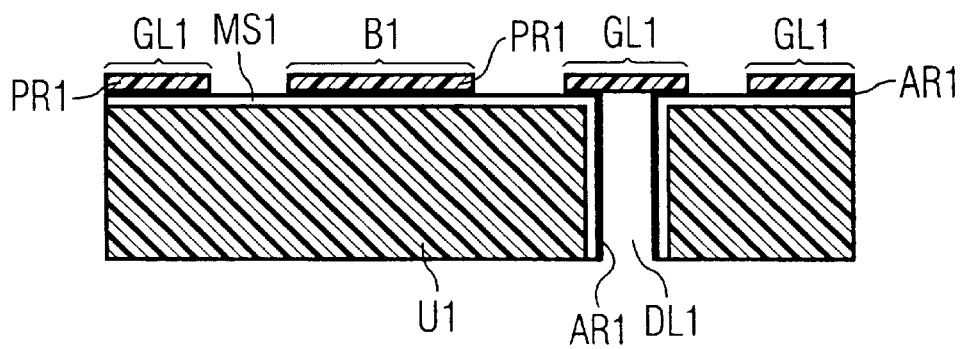

After the patterning of the photoresist PR1, in accordance with FIG. 5 the etching resist AR1 is removed in the uncovered regions. It can be seen that the etching resist AR1 is not removed in the region of the plated-through hole DL1 since it is protected from below by the photoresist and a corresponding sealing (not illustrated) of the plated-through hole DL1. In the exemplary embodiment portrayed, the removal—also referred to as stripping—of the etching resist AR1 is effected by a commercially available tin stripper that, however, must not attack the first photoresist PR1.

Figure 6:
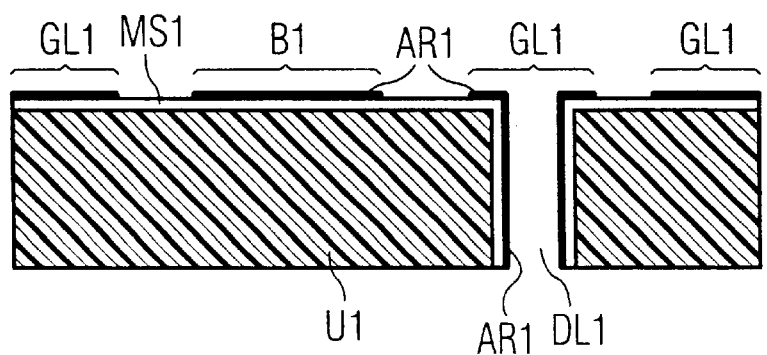

In the next step, the first photoresist PR1 is then completely removed in accordance with FIG. 6. The commercially available resist stripper used for this purpose must not attack the first etching resist AR1 in the process. It can be seen that the residual first etching resist AR1 covers the later coarse conductor structures GL1, the wall of the plated-through hole DL1 and the entire region B1 of the later fine conductor structures.

In a region B1, in accordance with FIGS. 6–7, the first etching resist AR1 is then patterned with the aid of a laser beam LS1 in such a way that it has the pattern of the later fine conductor structures FL1.

After the laser patterning in the region B1, it is then the case that, in accordance with FIG. 8, in order to form the coarse conductor structures GL1 and the fine conductor structures FL1, in a common etching process, the metal layer MS1 is etched away as far as the surface of the substrate U1 in the regions which are not protected by the etching resist AR1.

In the final step, the residual etching resist AR1 is then removed in accordance with FIG. 9. The tin stripper already mentioned is again used for this operation.

Figure 10:
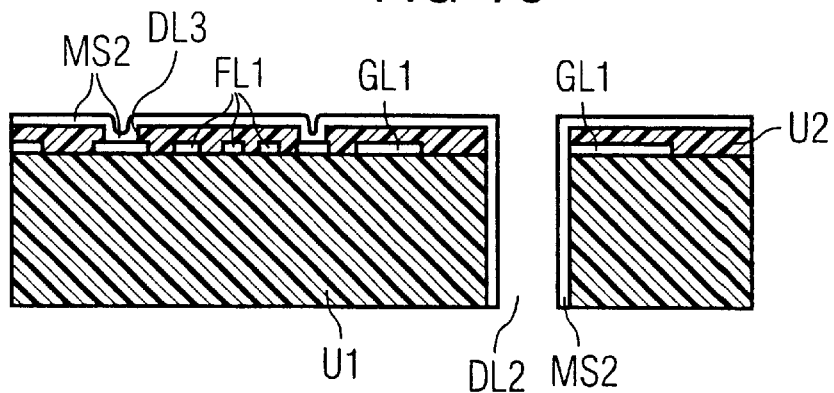

In the production of printed circuit boards having two wiring layers, the first wiring layer is produced with the coarse conductor structures GL1 and the fine conductor structures FL1 in accordance with the steps outlined above with reference to FIGS. 1 to 9. A corresponding first wiring layer can be seen from FIG. 10, the coarse conductor structures GL1 and the fine conductor structures FL1 differing somewhat from the structures shown in FIG. 9. A second, electrically insulating substrate U2 is then applied to the first wiring layer, for example by curtain coating and subsequent curing. At the locations of later plated-through holes, plated-through holes DL2 and DL3 are then introduced into the second substrate U2 for example by laser boring. During the application of a second metal layer MS2 to the second substrate U2, the walls of the plated-through holes DL2 and DL3 are then also metallized, in the way that can be seen from FIG. 10. It can also be seen that, in the case of the plated-through holes DL3, the second metal layer MS2 produces a contact with the underlying conductor structures of the first wiring layer.

Figure 11:
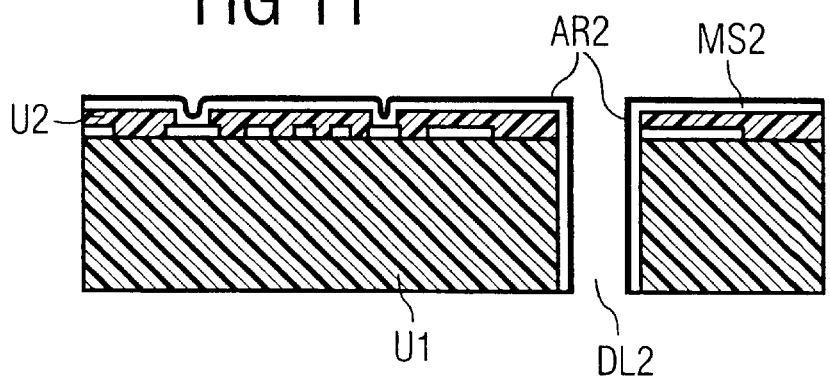
Figure 12:
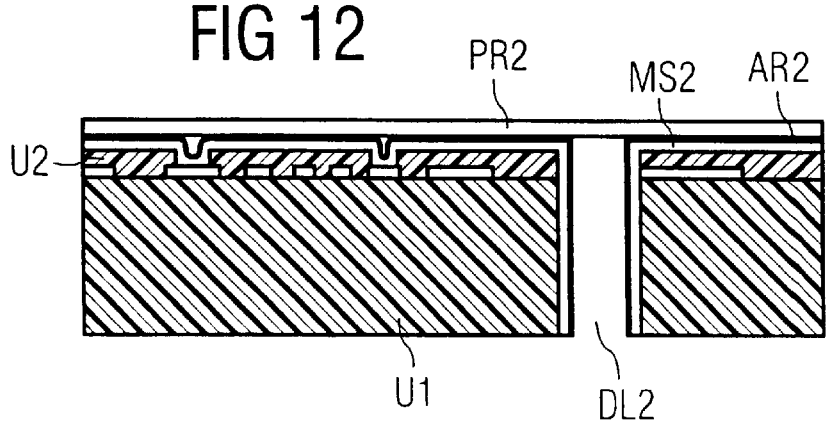

In the next step, in accordance with FIG. 11, a second etching resist AR2 is then applied to the second metal layer MS2. Afterward, in accordance with FIG. 12, a second photoresist PR2 is applied, which also spans the openings of the plated-through holes DL2 and DL3.

Figure 13:
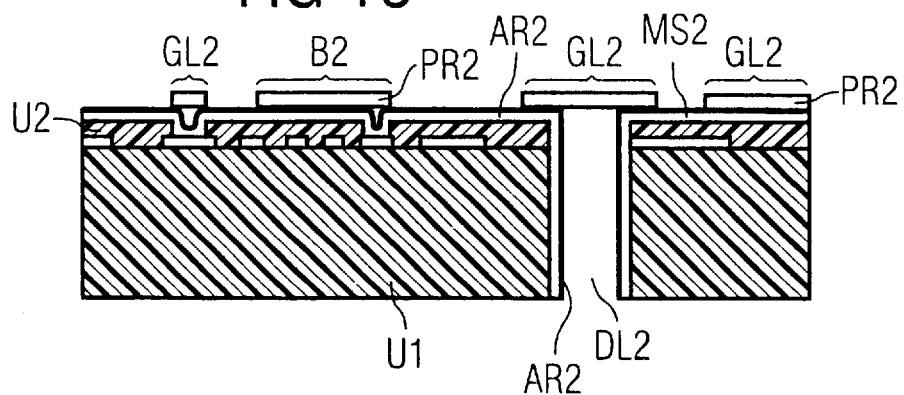

After the patterning of the second photoresist PR2 by exposure and development, it is then the case that, in accordance with FIG. 13, only the pattern of later coarse conductor structures GL2 and an entire region B2 of the later fine conductor structures of the second wiring layer are covered.

Figure 14:
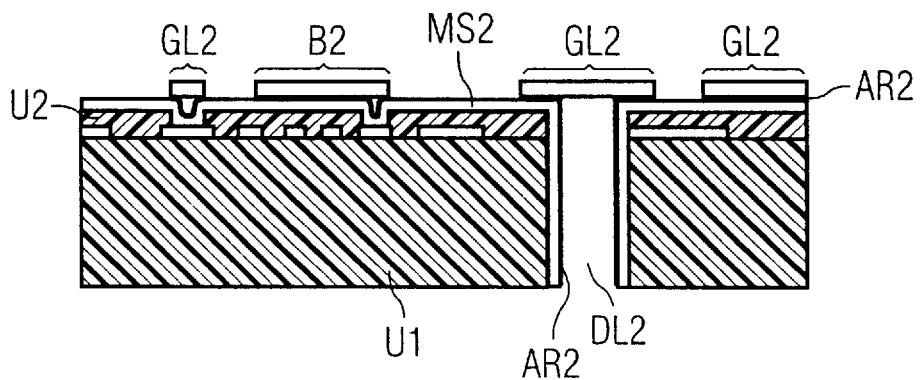
Figure 15:
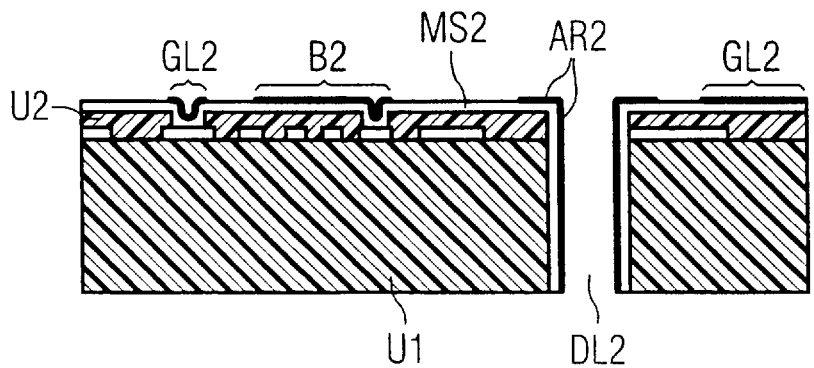

Afterward, in accordance with FIG. 14, the second etching resist AR2 which is not protected by the second photoresist PR2 is then removed, whereupon the second photoresist PR2 is completely removed in accordance with FIG. 15.

In the next step, in accordance with FIG. 16, in the region B2, the second etching resist AR2 is then patterned with the aid of a laser beam LS2 in such a way that it has the pattern of the second fine conductor structures FL2 of the second wiring layer.

After the laser patterning in the region B2 (see FIG. 16), it is then the case that, in accordance with FIG. 17, in order to form the coarse conductor structures GL2 and the fine conductor structures FL2 of the second wiring layer, in a common etching process, the second metal layer MS2 is etched away as far as the surface of the second substrate U2 in the regions which are not protected by the second etching resist AR2. In a final step, the residual second etching resist AR2 is then removed. The resulting printed circuit board with two wiring layers can be seen from FIG. 18.

We claim:

1. A method for producing wiring configurations, which comprises the steps of:

providing an electrically insulating substrate;

applying a metal layer to the electrically insulating substrate;

applying an etching resist to the metal layer;

applying a photoresist to the etching resist;

patterning the photoresist using photolithography such that a pattern of coarse conductor structures and a region of fine conductor structures are covered;

removing the etching resist in regions not covered by the photoresist;

removing the photoresist;

patterning the etching resist with a laser beam such that it has a pattern of the fine conductor structures; and etching away those regions of the metal layer which are not protected by the etching resist as far as a surface of the electrically insulating substrate in a common etching process to form the coarse conductor structures and the fine conductor structures.

2. The method according to claim 1, which comprises using a metallic etching resist as the etching resist.

3. The method according to claim 2, which comprises applying the metallic etching resist to the metal layer by one of externally electroless and electrical metal deposition.

4. The method according to claim 1, which comprise using one of tin and tin-lead as the etching resist.

5. The method according to claim 1, which comprises forming holes in the electrically insulated substrate in a region of at least one of the coarse conductor structures and the fine conductor structures, and applying the metal layer and the etching resist to walls of the holes resulting in plated-through holes.

6. The method according to claim 5, which comprises applying the photoresist such that openings of the plated-through holes are covered with the photoresist.

7. The method according to claim 1, which comprises completely removing the etching resist after the etching away step.

8. The method according to claim 1, which comprises:

forming a first wiring layer from at least one of the coarse conductor structures and the fine conductor structures on the electrically insulating substrate;

applying a further electrically insulating substrate to the first wiring layer;

forming further through holes in the further electrically insulating substrate;

applying a further metal layer to the further electrically insulating substrate including the further through holes resulting in further plated-through holes;

applying a further etching resist to the further metal layer;

applying a further photoresist to the further etching resist;

patterning the further photoresist using photolithography such that a pattern of further coarse conductor structures and a region of further fine conductor structures are covered;

removing the further etching resist in regions not covered by the further photoresist;

removing the further photoresist;

patterning the further etching resist with the laser beam such that it has the pattern of the further fine conductor structures;

etching away those regions of the further metal layer which are not protected by the further etching resist as far as a surface of the further electrically insulating substrate in a further common etching process to form the further coarse conductor structures and the further fine conductor structures; and forming a second wiring layer from the further coarse conductor structures and the further fine conductor structures.

* * * * *